(12) United States Patent
MacGearailt

(10) Patent No.: US 6,677,711 B2
(45) Date of Patent: Jan. 13, 2004

(54) PLASMA PROCESSOR METHOD AND APPARATUS

(75) Inventor: Niall MacGearailt, Kilcock (IE)

(73) Assignee: Lam Research Corporation, Fremont, CA (US)

( * ) Notice: Subject to any disclaimer, the term of this patent is extended or adjusted under 35 U.S.C. 154(b) by 179 days.

(21) Appl. No.: 10/028,312

(22) Filed: Dec. 28, 2001

(65) Prior Publication Data

US 2002/0185227 A1 Dec. 12, 2002

Related U.S. Application Data

(60) Provisional application No. 60/296,832, filed on Jun. 7, 2001.

(51) Int. Cl.$^7$ .................................................. H01J 7/24
(52) U.S. Cl. ............................ 315/111.21; 315/111.71; 118/723 R
(58) Field of Search .............. 318/111.21; 315/111.31, 315/111.71, 111.91, 111.81; 118/723, 723 R, 723 E, 723 I, 723 ER

(56) References Cited

U.S. PATENT DOCUMENTS

| | | | |
|---|---|---|---|
| 4,333,814 A | 6/1982 | Kuyel | 204/298 |
| 4,622,094 A | 11/1986 | Otsubo | 156/627 |
| 5,286,297 A * | 2/1994 | Moslehi et al. | 118/723 E |
| 5,605,576 A | 2/1997 | Sasaki et al. | 118/723 E |
| 5,643,364 A | 7/1997 | Zhao et al. | 118/723 E |
| 5,689,215 A | 11/1997 | Richardson et al. | 333/17.1 |
| 5,705,019 A | 1/1998 | Yamada et al. | 156/345 |
| 5,892,198 A | 4/1999 | Barnes et al. | 333/17.1 |
| 5,929,717 A | 7/1999 | Richardson et al. | 333/17.1 |
| 5,982,099 A | 11/1999 | Barnes et al. | 315/111.21 |
| 6,060,837 A | 5/2000 | Richardson et al. | 315/111.51 |
| 6,162,709 A * | 12/2000 | Raoux et al. | 438/513 |
| 6,265,831 B1 * | 7/2001 | Howald et al. | 315/111.21 |

OTHER PUBLICATIONS

Patent Abstracts of Japan, vol. 007, No. 280 (E–216), Dec. 14, 1983, JP 58 158929A.

* cited by examiner

*Primary Examiner*—Don Wong
*Assistant Examiner*—Jimmy T. Vu
(74) *Attorney, Agent, or Firm*—Lowe Hauptman Gilman & Berner LLP

(57) ABSTRACT

A vacuum plasma processor includes a voltage-current detector connected between a matching network and a reactive impedance for exciting gas in a chamber to a plasma for processing a workpiece. A constant non-zero AC parameter is maintained in a connection between an electrode in the chamber and ground. The electrode and connection to ground are such that no AC or DC source is DC coupled with the electrode.

29 Claims, 1 Drawing Sheet

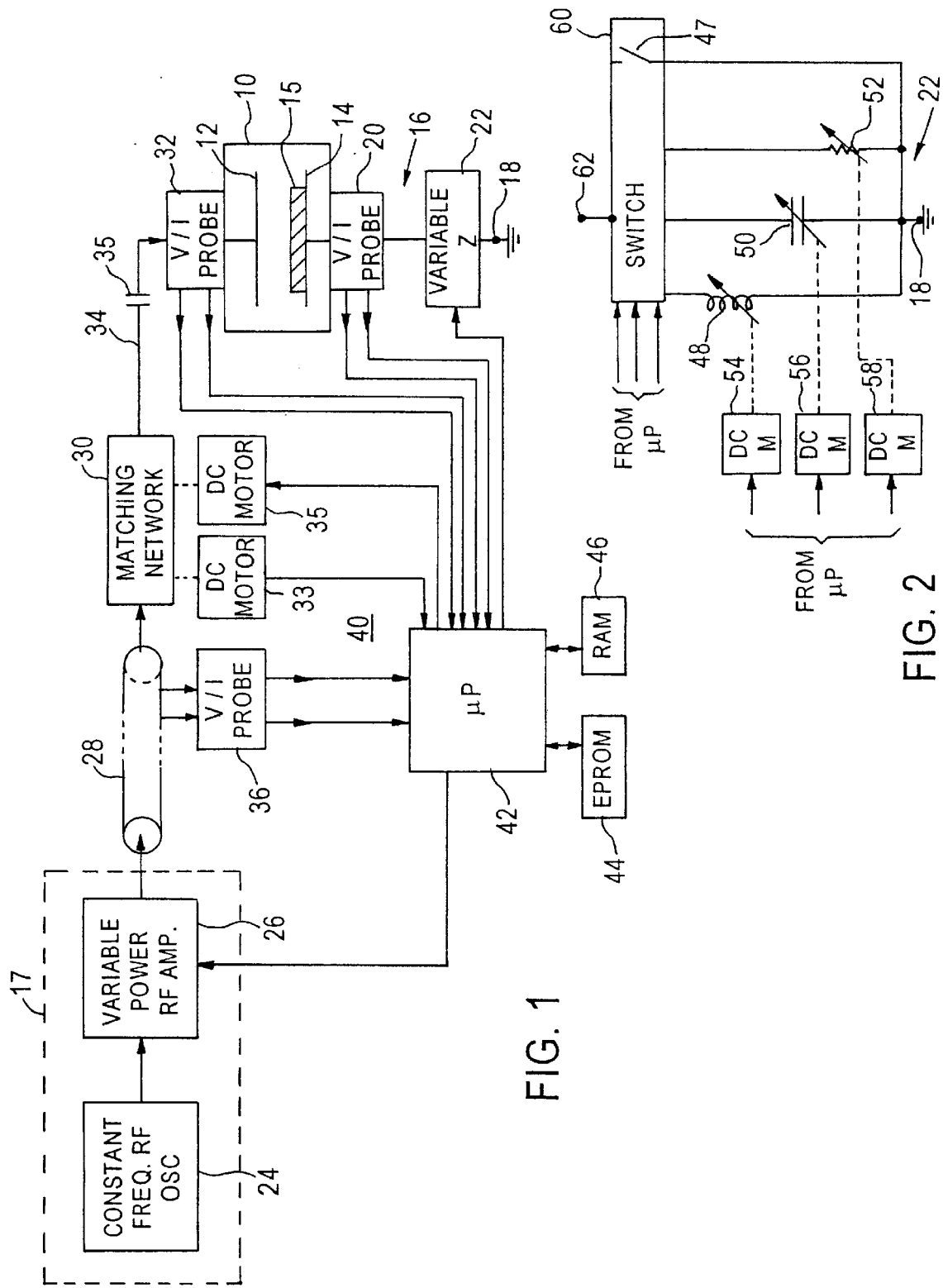

PLASMA PROCESSOR METHOD AND APPARATUS

RELATION TO CO-PENDING APPLICATION

The present application is a continuation-in-part of my co-pending, commonly assigned provisional application Ser. No. 60/296,832 filed Jun. 7, 2001, entitled "Apparatus for Accurate RF Delivery to a Plasma Chamber."

FIELD OF INVENTION

The present invention relates generally to vacuum plasma processor methods and apparatus and more particularly to a vacuum plasma processor method and apparatus wherein a constant, non-zero AC parameter is maintained between an electrode having a connection to ground such that no AC or DC source is DC coupled with the electrode.

BACKGROUND ART

Vacuum plasma processors are used to deposit materials on and etch materials from workpieces that are typically semiconductor, dielectric and metal substrates. A gas is introduced into a vacuum plasma processing chamber where the workpiece is located. The chamber pressure is typically in the range of 0.1 to 1000 torr. The gas is ignited into an RF plasma in response to an RF electric or electromagnetic field. The RF field is provided by a reactive impedance element, usually either an electrode array or a coil which couples both magnetic and electrostatic RF fields to the gas. The reactive impedance element is connected to an RF source having an RF frequency and sufficient power such that the gas is ignited into the plasma. Connections between the source and reactive impedance element are usually by way of a relatively long cable, connected directly to the RF source. A resonant matching network connected between the cable and reactive impedance element usually includes at least one variable reactance adjusted to match the impedance of the source to the load it is driving.

The load seen by the source is subject to substantial random, unpredictable variations. The load has a relatively high impedance prior to ignition of the gas into a plasma state. In response to the plasma being ignited, the load impedance drops substantially due to the presence of charge carriers, i. e., electrons and ions, in the excited plasma. The ignited plasma impedance also changes substantially during processing of workpieces due to variations in the plasma flux, i.e., the product of the plasma density and the plasma charge particle velocity.

The RF losses are also influenced by the physical makeup of the RF delivery path of the plasma processor, the hardware of the processor chamber and ground path impedance, which is subject to considerable variation at the RF frequencies exciting the plasma. The ground path impedance is determined by the physical makeup of the parts forming the ground, as well as the associated impedance of the ground path at the RF excitation frequency. The load is subject to these variations during processing of a single workpiece. In addition, the load is subject to these variations while the same processor is processing different workpieces. Further, the load is subject to these variations among different processors having the same nominal design, such as the same model number, because different processors have different unpredictable characteristics. The losses and impedance differences have a large effect on the performance of the processor, for example etch and deposition rates.

Previously, it was thought that control of the matching network variable reactance and the output power of the RF source could provide adequate compensation for these random, unpredictable variations. The matching network variable reactance is controlled to maintain an impedance match and resonance between the RF source output impedance and the load impedance.

In addition, control is frequently provided in response to a voltage probe connected between the matching network and the reactive impedance element. The voltage probe derives a signal indicative of the RF voltage between the reactive impedance element and a reference potential, such as ground, the potential at which a metal wall of the chamber is maintained. The signal indicative of the RF voltage between the reactive impedance element and the reference potential is coupled to a controller for an output parameter of the RF source, which is remote from the chamber and matching network. The controller is usually part of the RF source and includes a monitor for the current and voltage the RF source applies to an end of the cable connected to the RF source. The monitored current and voltage, either from the voltage probe connected between the matching network and reactive impedance element or the voltage monitor of the RF source, are combined to control output power of the RF source to a desired setpoint.

The assumption has been that the current monitored in the controller of the RF source is an accurate replica of the current flowing in the reactive impedance element and load. I have realized that this is an invalid assumption because of the loss effects of the cable connected between the RF source and the matching network, as well as other associated losses. In addition, the foregoing load variations have an adverse effect on this assumption. Because of this invalid assumption, desired power has not actually been supplied in many instances to the plasma during processing, with a resulting adverse effect on processor performance.

SUMMARY OF THE INVENTION

In accordance with the present invention, a plasma processor includes a vacuum plasma chamber for processing a workpiece, wherein the chamber includes a reactive impedance element for electrical coupling with gas in the chamber and an electrode having a connection to AC ground such that no AC or DC source is DC coupled with the electrode. The connection of the electrode to AC ground is such that a finite, non-zero AC voltage has a tendency to be developed between the electrode and AC ground. Sufficient power is supplied to the reactive impedance element to excite the gas in the chamber to a plasma while a constant finite, non-zero AC parameter, preferably voltage, is maintained between the electrode and AC ground in the connection.

Preferably the constant voltage is maintained between the electrode and AC ground in the connection by detecting AC voltage between the electrode and ground and/or AC current flowing between the electrode and ground. In response to the detected voltage and/or current in the connection, AC impedance between the electrode and ground in the connection is controlled to provide the substantially constant, finite non-zero AC parameter.

In one preferred embodiment, the AC impedance includes a variable reactance, preferably an inductor and/or resistor, and/or capacitor having a value controlled by the detected voltage and/or current in the connection. The detected voltage and/or current in the connection are used to control (1) whether the inductor, capacitor or resistor, or which combination thereof, is part of the connection and (2) the value(s) of the connected impedance(s).

As a result of the foregoing, ground impedance is maintained at a constant value to assist in accurately controlling power delivered to the plasma. Together, accurate control of delivered power and maintaining ground impedance at a constant value enable a user of the processor to have almost total control over many AC parameters having a large effect on processor performance. This is especially advantageous when matching multiple processors running the same process and maintaining process stability on the same processors over long time periods. The principles of accurately controlling delivered power and maintaining ground impedance at a constant value can also be used to maintain constant characteristics during the manufacture of processor can be accurately measured and adjusted to guarantee performance during manufacturing of the processors, prior to shipping the processors to the end-user.

Plasma processors that maintain a constant finite non-zero AC parameter between the electrode and AC ground in the connection are preferably, but not necessarily, employed with arrangements for controlling an AC source driving a reactive impedance element maintaining constant power across a load including the reactive impedance and the plasma it excites.

The above and still further objects, features and advantages of the present invention will become apparent upon consideration of the following detailed description of a specific embodiment thereof, especially when taken in conjunction with the accompanying drawings.

BRIEF DESCRIPTION OF THE DRAWING

FIG. 1 is a block diagram of a preferred embodiment of a vacuum plasma processor of the invention; and FIG. 2 is a schematic diagram of a variable impedance included in the processor of FIG. 1.

DETAILED DESCRIPTION OF THE DRAWING

Reference is now made to FIG. 1 of the drawing wherein vacuum plasma processing chamber 10 is illustrated as including parallel metal electrode plates 12 and 14 between which an RF plasma discharge is excited. The plasma is derived by plate 12, which is mounted at the top of chamber 10 and functions as an RF excitation reactance that supplies RF energy to gas from a gas source (not shown). Chamber 10 is maintained at a vacuum in the range of 0.1 to 1000 torr by a suitable vacuum pump (not shown). Workpiece 15, typically a semiconductor, glass or metal substrate, is mounted on plate 14 at the bottom of chamber 10. Workpiece 15 is processed by charge particles, i.e., electrons and ions, and neutral particles in the plasma so the workpiece is etched and/or material is deposited in thereon. The plasma discharge and plate 12 form a load for RF source 17 and the circuit elements driven by it. If it is necessary to cool workpiece 16 by supplying it with a cooling gas that flows through plate 14, plate 14 includes a chuck for the workpiece. If a chuck is employed, it is preferably an electrostatic chuck responsive to a DC chucking voltage source (not shown).

An RF connection 16 having a low RF impedance is provided between plate 14 and ground terminal 18. Connection 16 has no RF excitation source directly connected or coupled to it, but can include the DC chucking voltage source, if such a source is provided. Despite the fact that connection 16 has no RF excitation source directly connected or coupled to it and connection 16 has a relatively high conductivity path between plate 14 and ground terminal 18, I found that random, variable voltages have a tendency to be developed in prior art processors in connection 16 between plate 14 and ground terminal 18. This random, variable voltage has adverse effects in providing consistent processing of workpiece 15.

To overcome this problem, a constant voltage is maintained in connection 16 between plate 14 and ground terminal 18. The constant voltage is maintained by mounting a voltage-current probe 20 on the outside of chamber 10 immediately below plate 14. Probe 20 is mounted so that it is electrically and magnetically coupled to a lead of connection 16. Probe 20 derives first and second signals respectively replicas of the RF voltage between plate 14 and ground terminal 18 and the RF current flowing in connection 16 between plate 14 and ground terminal 18. In addition, connection 16 is provided with variable RF impedance 22 which is adjusted in response to a function of the first and second signals to maintain a constant finite, non-zero RF voltage between plate 14 and ground terminal 18.

RF source 17 includes constant frequency RF oscillator 24, typically having a frequency of 13.56 MHz, and variable power RF amplifier 26, having a power input terminal connected to be responsive to the output of oscillator 24 and a variable gain control input terminal. Amplifier 26 derives a relatively high power RF output, having a desired setpoint value, typically in the range of 1–4 kilowatts. The output of amplifier 26, at the frequency of oscillator 24, is connected to one end of a relatively long (for example, 13 feet) coaxial cable 28, having a second end connected to an input terminal of matching network 30, having an output terminal connected to supply RF power to plate 12

Thus, cable 28 has a length that is at least several wavelengths of the frequency of oscillator 24 and causes substantial RF losses to be introduced between its two opposite ends. As a result of the length of cable 28 and these losses, the RF current flowing from RF source 17 into cable 28 differs from the RF current matching network 30 supplies to plate 12.

To accurately monitor the RF current that source 17 supplies to plate 12, as well as the RF voltage between plate 12 and ground terminal 18, voltage-current probe 32 is mounted on or in very close proximity (within $\frac{1}{8}$ of a wavelength of the frequency of oscillator 24) to the outer surface of chamber 10 immediately above plate 12. Voltage-current probe 32 is electrically and magnetically coupled to lead 34, connected between the output of matching network 30 and plate 12, to derive third and fourth signals respectively replicas of the RF voltage between plate 12 and ground terminal 18 and the RF current flowing in lead 34.

Matching network 30 includes at least a pair of variable reactances adjusted so there is an impedance match between the output impedance of variable power RF amplifier 26 and the impedance of the load formed by plate 12 and the plasma excited by the plate. The variable reactances of matching network 30 are adjusted by DC motors 33 and 35 in response to a function of output signals of voltage-current probe 36, electrically and magnetically coupled to be responsive to the voltage between the interior conductor and ground of cable 28 and the current flowing in the cable. Probe 36, like probes 20 and 32, derives output signals that are replicas of the RF voltage and current the probe detects.

In one preferred embodiment, resonant matching network 30 is mounted on the exterior of chamber 10 and includes a transformer having a variable inductance primary winding, connected in series with a fixed capacitor. The transformer includes a secondary winding magnetically coupled to a variable tuning vane. The RF output of matching network 30 is coupled to plate 10 via DC blocking capacitor 37, serially connected in line 34. Capacitor 37 is also preferably mounted on the exterior of chamber 10. DC motors 33 and 35 respond to output signals of controller 40 to control the matching network tuning vane and the inductance of the primary winding of matching network 30.

Controller 40, including microprocessor 42, electronically programmable read-only memory (EPROM) 44 and random access memory (RAM) 46, responds to the output signals of probes 20, 32 and 36 to derive signals for controlling (1) the constant RF voltage to be maintained across variable impedance 22 and/or the constant RF current that flows through variable impedance 22 or the RF power dissipated in connection 16, (2) the power gain (and thus the output power) of variable power RF amplifier 26, and (3) the voltages applied to DC motors 33 and 35. The signals that controller 40 applies to DC motors 33 and 35 control the variable reactances of matching network 30 and thus, resonance of network 30 and the impedance match between the output impedance of amplifier 26 and the load it drives.

Controller 40 also derives signals to control impedance 22 between plate 12 and ground terminal 18 so a constant predetermined RF parameter, usually voltage, is maintained in connection 16. EPROM 44 stores setpoint signals for (1) the desired power RF load from plate 12 to ground terminal 18, and (2) the desired constant RF voltage to be maintained between plate 14 and ground terminal 18 in connection 16. Alternatively, EPROM 44 stores a setpoint signal for a constant RF current flowing in connection 16 between plate 14 and ground terminal 18 or setpoint signals for constant RF voltage and both constant RF current associated with connection 16.

Microprocessor 42 responds to the voltage and current replicas that probe 32 derives to calculate the power dissipated in the load between plate 12 and ground terminal 18 in accordance with:

$$V_1 I_1 \cos \theta$$

where:
- $V_1$ is the voltage probe 32 detects,
- $I_1$ is the current probe 32 detects, and
- $\theta$ is the phase angle between the voltage and current probe 32 detects.

Microprocessor 42 compares the calculated power with a setpoint value of power, as stored in EPROM 44, to derive a control signal for the power gain and output power of amplifier 26. Thereby, the RF power that amplifier 26 supplies to cable 28 is controlled to maintain the RF power between plate 12 and ground terminal 18 constant, at the set point EPROM 44 stores.

Alternatively, microprocessor 42 can respond to the voltage magnitude and phase angle of the replicas probe 32 derives to adjust the voltage RF source 17 applies to one end of cable 28. Or, microprocessor 42 can adjust the RF current that RF source 17 applies to cable 28. If a variable current amplifier is controlled, microprocessor 42 responds to the current replica probe 32 derives, as well as the phase angle between the replicas the probe derives. If the voltage or current that RF source 17 applies to cable 28 is controlled, rather than the power applied to the cable, variable voltage or variable current amplifiers respectively replace the variable power amplifier 26 of RF source 17.

Microprocessor 42 responds to the output signals of probe 36 to control DC motors 33 and 35 and therefore the variable reactances of matching network 30 in a conventional manner. Microprocessor 42 also responds to the magnitude as well as the phase angle of the voltage and current replicas that probe 20 derives to control the nature and magnitude of variable impedance 22. Microprocessor 42 responds in an iterative manner to the voltage and current replicas that probe 20 derives to connect one or more appropriate impedances of variable impedance 22 in connection 16 and to control the values of the one or more impedances.

FIG. 2 is a schematic diagram of a preferred configuration of variable impedance 22. Variable impedance 22 includes four separate branches, respectively including switch contacts 47 (incorporated in switch 60), variable inductor 48, variable capacitor 50 and variable resistor 52. Inductor 48, capacitor 50 and resistor 52 have values respectively controlled by DC motors 54, 56 and 58 in response to signals from microprocessor 42, while contacts 47 are initially closed when a determination is made as to which branch(es) is/are to be connected in connection 16. One terminal of each of contacts 47, inductor 48, capacitor 50 and resistor 52 is connected to ground and the other terminal of these elements is selectively connected by switch 60 to terminal 62, in turn connected to plate 14 via voltage-current probe 20.

Switch 60 includes contacts 47, as well as other contacts (not shown), and three input terminals responsive to a three-bit signal microprocessor 42 derives to provide eight different combinations for the connections of contacts 47, inductor 48, capacitor 50 and resistor 52 to terminal 62. In particular, each of impedance elements 48, 50 and 52 can be separately connected one at a time to terminal 62 by the contacts of switch 60 other than contacts 47. The impedance elements can also be connected in parallel pairs to terminal 62 or all three of the impedance elements can be connected in parallel to terminal 62. Initially, switch 60 is set so impedance 22 is a short circuit by virtue of contacts 47 being closed.

EPROM 44 stores a desired setpoint value for an RF parameter associated with connection 16; usually the parameter is the RF voltage between plate 14 and ground terminal 18, but the parameter can be the RF current flowing in connection 16 or the RF power dissipated in the connection. A typical value of the setpoint is (20+j0) volts and the specific embodiment is described in connection with RF voltage.

Initially, microprocessor 42 responds to the replicas probe 20 derives when impedance 22 is a short circuit to calculate the initial complex voltage between plate 14 and ground terminal 18, based on the magnitude of the voltage replica and the phase angle between the voltage and current replicas that probe 20 derives. Microprocessor 42 determines from the initial complex voltage whether the initial phase angle is zero, or whether the voltage is leading the current or the current is leading the voltage.

After microprocessor 42 makes the phase determination, it removes the short circuit of impedance 22 by opening contacts 47. If the initial phase angle between the voltage and current replicas that probe 20 derives is zero, microprocessor 42 supplies a signal to activate switch 60 to connect only resistor 52 in circuit between terminal 62 and ground. This connection is made since the setpoint voltage between plate 14 and ground terminal 18 can be achieved with no reactive component in impedance 22. If the initial voltage and current replicas that probe 20 derives indicate the voltage is leading the current, microprocessor 42 activates switch 60 to connect capacitor 50 and perhaps resistor 52 between terminal 62 and ground. If, however, the replicas that probe 20 derives indicate the voltage lags the current, microprocessor 42 controls switch 60 to connect inductor 48 and perhaps resistor 52 in circuit between terminal 62 and ground.

After the appropriate connection(s) between impedance elements 48, 50 and 52 have been established through switch 60, microprocessor 42 supplies signals to at least one of motors 54, 56 and 58 to control the value(s) of the impedance element(s) 48, 50 or 52 connected in circuit between terminal 62 and ground. The signals are iteratively supplied to switch 60 and motors 54, 56 and 58 until probe 20 supplies microprocessor 42 with current and voltage replicas that cause the microprocessor to calculate a complex voltage equal to the desired, setpoint voltage between plate 14 and ground terminal 18.

Control of amplifier 26 and variable impedance 22 is, for example, performed during processing of a single workpiece at a foundry. In addition, control of amplifier 26 and variable impedance 22 is performed while different workpieces are being processed at a foundry. In addition, control of amplifier 26 and variable impedance 22 can be provided for different processors during processor manufacturing, at the manufacturer's facility, to assure that different processors of the same nominal type, as delivered, have consistent characteristics.

While there has been described and illustrated a specific embodiment of the invention, it will be clear that variations in the details of the embodiment specifically illustrated and described may be made without departing from the true spirit and scope of the invention as defined in the appended claims.

I claim:

1. In combination,
   a vacuum plasma chamber for processing a workpiece, the chamber including a reactive impedance element for electrical coupling with gas in the chamber;
   an AC electric source having sufficient power to excite the gas in the chamber to a plasma connected to the reactive impedance element; and
   the chamber including an electrode having a connection to AC ground such that no AC or DC source is DC coupled with said electrode, the connection of the electrode to AC ground being such that a finite, non-zero AC voltage has a tendency to be developed between the electrode and AC ground, the connection of the electrode to AC ground including an AC impedance arranged so that there is a substantially constant finite, non-zero AC parameter maintained between the electrode and AC ground.

2. The combination of claim 1 further including a detector arrangement for detecting at least one AC parameter in the connection between the electrode and ground, and a controller connected to be responsive to the detector arrangement for controlling the AC impedance to provide the substantially constant, finite non-zero AC parameter.

3. The combination of claim 2 wherein the AC impedance includes a variable reactance, the controller being arranged to be responsive to the detector arrangement for controlling the value of the variable reactance.

4. The combination of claim 3 wherein the variable reactance comprises a variable inductor.

5. The combination of claim 3 wherein the variable reactance comprises a variable capacitor.

6. The combination of claim 3 wherein the variable reactance comprises a variable inductance and a variable capacitor, the controller being arranged to be responsive to the detector arrangement for selectively connecting at least one of the variable inductor and the variable capacitor in the connection of the electrode to ground.

7. The combination of claim 2 wherein the detector arrangement includes a voltage-current probe coupled with the connection.

8. The combination of claim 2 wherein the detector arrangement is mounted on the chamber.

9. The combination of claim 8 wherein the AC impedance includes a variable resistor, the controller being arranged to be responsive to the detector arrangement for selectively connecting the variable resistor in the connection of the AC electrode to AC ground and for controlling the value of the variable resistor.

10. The combination of claim 1 wherein the chamber includes a reactive impedance element for electrical coupling with gas in the chamber;
    an AC electric source having sufficient power to excite the gas in the chamber to a plasma;
    a matching network connected between the source and the reactive impedance element;
    a cable having one end connected to the AC electric source and a second end connected to the matching network;
    a probe connected between the matching network and the reactive impedance element for deriving at least one signal indicative of a parameter applied by the matching network to the reactive impedance element and the plasma load coupled to the reactive impedance element; and
    a controller connected to be responsive to the at least one signal for controlling a parameter that influences the power the AC electric source applies to said one end of the cable.

11. The combination of claim 10 wherein the probe is arranged for deriving first and second signals respectively indicative of the voltage and current applied by the matching network to the reactive impedance element and the plasma load coupled to the reactive impedance element and the controller is connected to be responsive to the first and second signals.

12. The combination of claim 10 wherein the probe is mounted within $\frac{1}{8}$ of a wavelength of the frequency of the AC source of the vacuum plasma chamber.

13. The combination of claim 11 wherein the probe is mounted on the chamber.

14. The combination of claim 10 wherein the matching network includes a variable reactance, and further including a detector arrangement for deriving signals indicative of the voltage and current supplied by the cable to the matching network, the controller being connected to be responsive to signals indicative of the voltage and current supplied by the cable to the matching network for controlling the variable reactance of the matching network.

15. A method of processing a workpiece with a plasma in a vacuum plasma processing chamber including a reactive impedance element for electrical coupling with gas in the chamber and an electrode having a connection to AC ground such that no AC or DC source is DC coupled with said electrode, the connection of the electrode to AC ground being such that a finite, non-zero AC voltage has a tendency to be developed between the electrode and AC ground, the method comprising supplying sufficient power to the reactive impedance element to excite the gas in the chamber to a plasma while maintaining in the connection a constant finite, non-zero AC parameter between the electrode and AC ground.

16. The method of claim 15 wherein the parameter is voltage and the connection of the electrode to AC ground includes an AC impedance, and the constant finite non-zero AC voltage between the electrode and AC ground being provided by maintaining a constant AC voltage across the AC impedance in the connection.

17. The method of claim 15 wherein the method is performed in connection with a plurality of workpieces and the same constant, non-zero AC voltage is maintained between the electrode and ground while the plural workpieces are being processed in the vacuum plasma chamber.

18. The method of claim 15 wherein the method is performed in connection with a plurality of vacuum plasma chambers having substantially the same characteristics, the characteristics of the different vacuum plasma chambers differing from each other sufficiently to cause a tendency for different non-zero AC voltages to be developed in the connection between the electrode and ground of the different chambers, and maintaining the same constant, non-zero AC voltages between the electrode and ground in the plural vacuum plasma chambers operating under the same nominal conditions.

19. The method of claim 15 wherein the method is performed by connecting an AC impedance in the connection between the electrode and AC ground and maintaining a constant finite, non-zero AC voltage across the AC impedance.

20. The method of claim 19 wherein the constant finite, non-zero AC voltage between the electrode and ground is maintained by detecting at least one parameter indicative of AC voltage between the electrode and ground and AC current flowing between the electrode and ground, and controlling the AC impedance in response to the detected at least one parameter.

21. The method of claim 20 wherein the finite non-zero AC voltage across the AC impedance is maintained constant by controlling the value of the AC impedance in response to the detected at least one parameter.

22. The method of claim 21 wherein the AC impedance includes a variable capacitor and a variable inductor, and the controlling step includes connecting one or both of the variable capacitor and variable inductor in the connection between the electrode and AC ground.

23. The method of claim 21 wherein the AC impedance includes a variable reactance and a variable resistor, and the controlling step includes connecting one or both of the variable reactance and the variable resistor in the connection between the electrode and AC ground, and controlling the value of the variable reactance or the variable resistor.

24. The method of claim 15 wherein the chamber includes a reactive impedance element electrically coupled with gas in the chamber, a matching network connected between the source and the reactive impedance element, a cable having one end connected to the AC electric source and a second end connected to the matching network, the method further comprising detecting at least one parameter applied by the matching network to the reactive impedance element and the plasma load coupled to the reactive impedance element; and controlling a parameter that influences the AC power the AC electric source applies to said one end of the cable in response to the detected at least one parameter.

25. The method of claim 24 wherein the at least one parameter includes voltage and current.

26. The method of claim 24 wherein the voltage and current are detected within $\frac{1}{8}$ of a wavelength of the frequency of the AC source of the vacuum plasma chamber.

27. The method of claim 24 wherein the voltage and current are detected at the chamber.

28. The method of claim 24 wherein the controlling step includes controlling a plurality of parameters that influence the AC power the AC electric source applies to said one end of the cable.

29. The method of claim 24 wherein the matching network includes a variable reactance, the method further comprising the steps of detecting the voltage and current supplied by the cable to the matching network, and controlling the variable reactance of the matching network in response to the detected voltage and current supplied by the cable to the matching network.

* * * * *